US011405016B2

(12) United States Patent
Inoue et al.

(10) Patent No.: US 11,405,016 B2
(45) Date of Patent: Aug. 2, 2022

(54) RESONATOR AND RESONANCE DEVICE

(71) Applicant: Murata Manufacturing Co., Ltd., Nagaokakyo (JP)

(72) Inventors: Yoshihisa Inoue, Nagaokakyo (JP); Ryota Kawai, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 389 days.

(21) Appl. No.: 16/814,058

(22) Filed: Mar. 10, 2020

(65) Prior Publication Data

US 2020/0212877 A1    Jul. 2, 2020

Related U.S. Application Data

(63) Continuation of application No. PCT/JP2018/016709, filed on Apr. 25, 2018.

(30) Foreign Application Priority Data

Sep. 28, 2017  (JP) ............................. JP2017-188208

(51) Int. Cl.
  *H03H 9/05*    (2006.01)
  *H03H 3/04*    (2006.01)
  (Continued)

(52) U.S. Cl.
  CPC ............ *H03H 9/0595* (2013.01); *H03H 3/04* (2013.01); *H03H 9/1057* (2013.01); *H03H 9/2489* (2013.01); *H03H 2003/0435* (2013.01)

(58) Field of Classification Search
  CPC .. H03H 9/0595; H03H 9/1057; H03H 9/2489; H03H 3/04; H03H 2003/0435
  See application file for complete search history.

(56) References Cited

U.S. PATENT DOCUMENTS 10,374,569 B2     8/2019  Umeda et al.
10,879,873 B2 *  12/2020  Inoue ...................... H03H 9/24
                         (Continued)

FOREIGN PATENT DOCUMENTS

JP    2012065293 A    3/2012
JP    2014107817 A    6/2014
                     (Continued)

OTHER PUBLICATIONS

International Search Report Issued for PCT/JP2018/016709, dated Jul. 3, 2018.

(Continued)

*Primary Examiner* — Jeffrey M Shin
(74) *Attorney, Agent, or Firm* — ArentFox Schiff LLP

(57) ABSTRACT

A resonator includes a vibration portion with a vibration arm extending from a base and having an open end that performs bending vibration. The vibration portion includes upper and lower electrodes with a piezoelectric film disposed therebetween that causes bending vibration of the vibration arm when a voltage is applied between the upper and lower electrodes. A protective film faces the piezoelectric film with the upper electrode interposed therebetween and a conductive film faces the piezoelectric film with the protective film interposed therebetween. Moreover, the conductive film is exposed in a region at the open end and a via electrode is formed in the protective film to electrically connect the conductive film to one of the upper and lower electrodes. The via electrode is positioned closer to a first region than the open end in the second region of the vibration arm in a plan view of the piezoelectric film.

20 Claims, 7 Drawing Sheets

(51) Int. Cl.
    *H03H 9/10*     (2006.01)
    *H03H 9/24*     (2006.01)

(56) References Cited

U.S. PATENT DOCUMENTS

2018/0226937 A1   8/2018   Umeda et al.
2019/0097600 A1   3/2019   Yoshii et al.

FOREIGN PATENT DOCUMENTS

WO     2016159022 A1   10/2016
WO     2017090380 A1    6/2017
WO     2017208568 A1   12/2017

OTHER PUBLICATIONS

Written Opinion of the International Searching Authority issued for PCT/JP2018/016709, dated Jul. 3, 2018.

* cited by examiner

RESONATOR AND RESONANCE DEVICE

CROSS REFERENCE TO RELATED APPLICATIONS

The present application is a continuation of PCT/JP2018/016709 filed Apr. 25, 2018, which claims priority to Japanese Patent Application No. 2017-188208, filed Sep. 28, 2017, the entire contents of each of which are incorporated herein by reference.

TECHNICAL FIELD

The present invention relates to a resonator and a resonance device.

BACKGROUND

Currently, resonators, such as piezoelectric vibrators, are used as devices for implementing a clocking function in an electronic device. With miniaturization of electronic devices, resonators are also required to be miniaturized, and resonators manufactured by Micro Electro Mechanical Systems (MEMS) technology (hereinafter also referred to as "MEMS vibrators") have attracted attention.

In the MEMS vibrators, there may be variations in resonant frequency due to manufacturing variations. Therefore, frequencies are adjusted by additional etching or the like during or after manufacturing of the MEMS vibrators.

For example, Patent Document 1 (identified below) discloses a configuration in which a vibrator having a plurality of vibration arms adjusts a resonant frequency by reducing a mass portion for coarse adjustment provided on a distal end side of a vibration arm and a mass portion for fine adjustment provided on a base end side of the vibration arm.

Patent Document 1: Japanese Unexamined Patent Application Publication No. 2012-065293.

The mass portion described in Patent Document 1 includes an insulator layer and a conductive layer formed on the insulator layer. In the MEMS vibrator, when such a mass portion is formed and the resonant frequency is adjusted by using an ion beam, a pyroelectric material, or the like, the insulator layer may be charged in some cases. When the MEMS vibrator vibrates in a state where the insulator layer on the MEMS vibrator is charged, Coulomb force is generated due to electric charges in the insulator layer, and the resonant frequency varies.

Further, in a vibrator having a plurality of vibration arms as described in Patent Document 1, since a movable range of a distal end of the vibration arm is larger than that of a base end, for example, the distal end of the vibration arm collides with a lid, cover or the like due to falling impact of the vibrator, and the distal end may be damaged.

SUMMARY OF THE INVENTION

The present invention has been made in view of such circumstances. Thus, it is an object of the present invention to suppress influence of electric charges charged on an insulator layer on the resonator or a conductive layer on the insulator layer on a resonant frequency, and to improve strength.

Accordingly, a resonator according to an exemplary aspect includes a vibration portion including one or more vibration arms that have a fixed end and an open end and that performs bending vibration, and a base including a front end connected to the fixed end of the vibration arm, and a rear end facing the front end. Moreover, the resonator includes a holding portion provided so as to surround at least a part of the vibration portion, and a holding arm connecting the vibration portion and the holding portion. The vibration portion further includes an upper electrode and a lower electrode, a piezoelectric film provided between the upper electrode and the lower electrode, having a main surface facing the upper electrode, and causing bending vibration of the vibration arm when a voltage is applied between the upper electrode and the lower electrode. Moreover, a protective film is provided so as to face the main surface of the piezoelectric film with the upper electrode interposed between the protective film and the main surface of the piezoelectric film, exposed in a first region in the vibration arm, and made of an insulator, a conductive film is provided so as to face the main surface of the piezoelectric film with the protective film interposed between the conductive film and the main surface of the piezoelectric film, and exposed in a second region that is a region being in a vicinity of the open end and being adjacent to the first region in the vibration arm, and a via electrode is formed in the protective film to electrically connect the conductive film to any one of the upper electrode and the lower electrode. In addition, the via electrode is positioned in a portion closer to the first region than the open end in the second region of the vibration arm when the main surface of the piezoelectric film is viewed in a plan view.

According to the exemplary embodiments of the present invention, the influence on the resonant frequency of the electric charges charged in the insulator layer on the resonator or the conductive layer on the insulator layer can be suppressed and the strength can be improved.

DETAILED DESCRIPTION OF EMBODIMENTS

First Exemplary Embodiment

Figure 1:
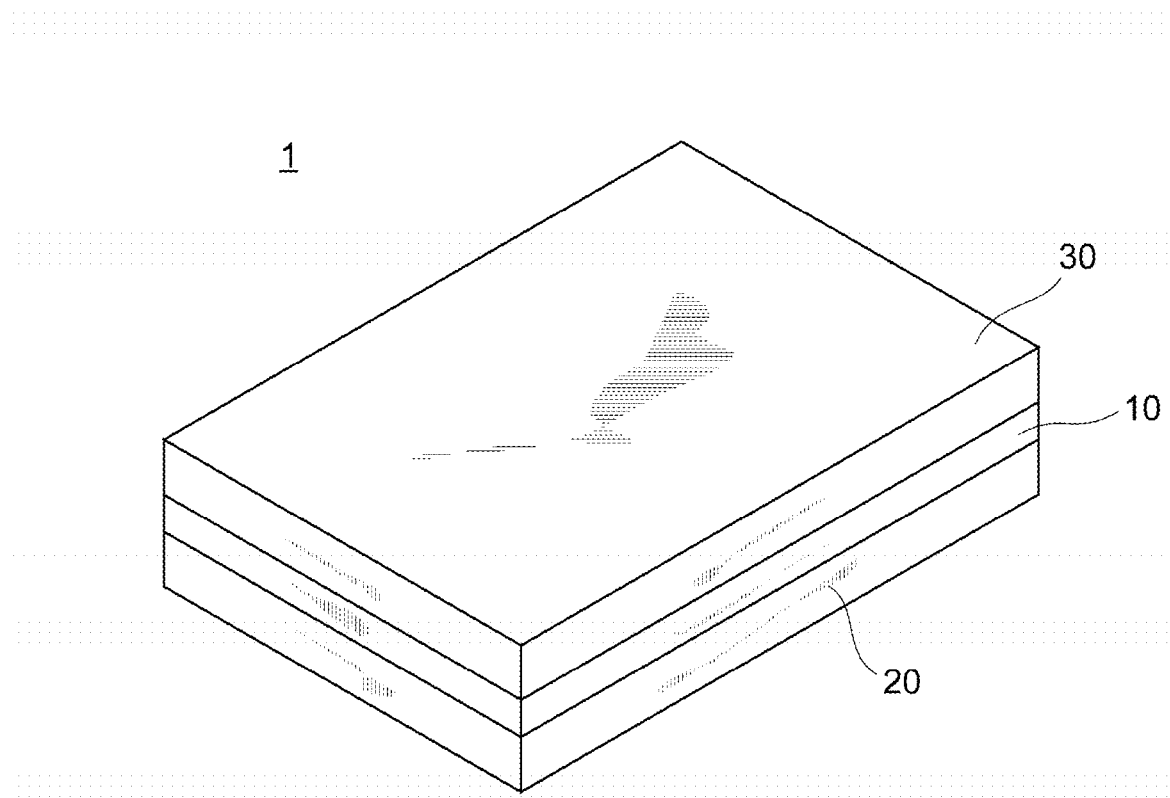
FIG. 1 is a perspective view schematically showing an appearance of a resonance device according to a first exemplary embodiment of the present invention.
Figure 2:
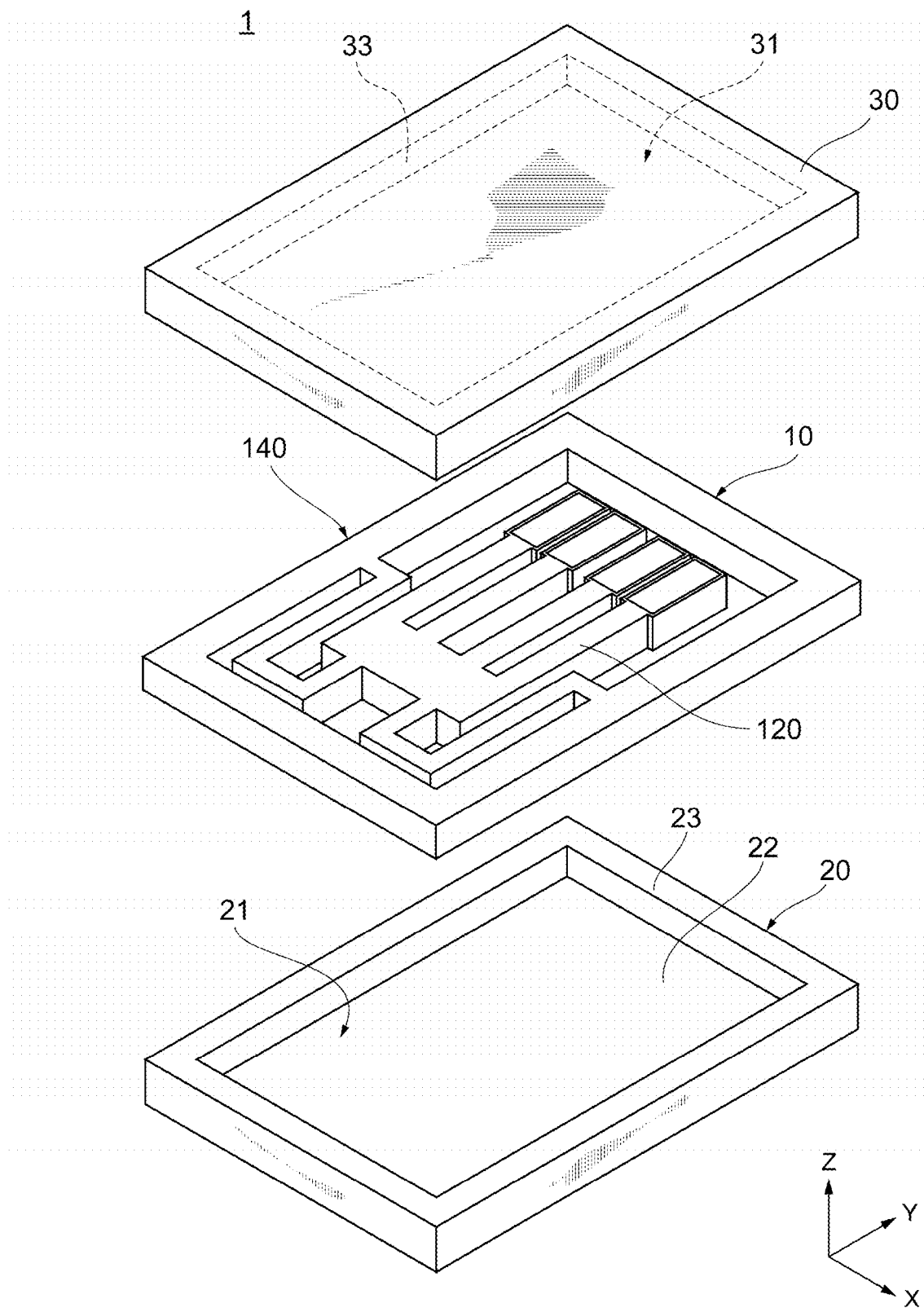
FIG. 2 is an exploded perspective view schematically showing a structure of the resonance device according to the first exemplary embodiment of the present invention.

Hereinafter, the first exemplary embodiment of the present invention will be described with reference to the accompanying drawings. FIG. 1 is a perspective view schematically showing an appearance of a resonance device 1 according to the first embodiment of the present invention. FIG. 2 is an exploded perspective view schematically showing a structure of the resonance device 1 according to the first embodiment of the present invention.

As shown, the resonance device 1 includes a resonator 10, and an upper lid 30 and a lower lid 20 which are provided so as to face each other with the resonator 10 interposed therebetween. That is, the resonance device 1 is configured by laminating the lower lid 20, the resonator 10, and the upper lid 30 in this order according to an exemplary aspect.

Further, the resonator 10, and the lower lid 20 and the upper lid 30 are bonded to each other, respectively, whereby the resonator 10 is sealed, and a vibration space of the resonator 10 is formed. Each of the resonator 10, the lower lid 20, and the upper lid 30 is formed by using a Si substrate, for example. Additionally, the resonator 10, the lower lid 20 and the upper lid 30 are bonded to each other by bonding the Si substrates to each other. Moreover, the resonator 10 and the lower lid 20 may be formed by using an SOI substrate, for example.

The resonator 10 is a MEMS resonator manufactured by using MEMS technology. Additionally, in this embodiment, a case in which the resonator 10 is formed by using a silicon substrate will be described as an example. Hereinafter, each component of the resonance device 1 will be described in detail.

Upper Lid 30

The upper lid 30 spreads in a flat plate shape along an XY plane, and a concave portion 31 having, for example, a flat rectangular parallelepiped shape is formed on a rear surface of the upper lid 30. The concave portion 31 is surrounded by a side wall 33, and forms a part of the vibration space which is a space in which the resonator 10 vibrates and is disposed therein.

Lower Lid 20

The lower lid 20 includes a bottom plate 22 having a rectangular flat plate shape and provided along the XY plane, and a side wall 23 extending from a peripheral edge portion of the bottom plate 22 in a Z-axis direction (that is, in a laminating direction of the lower lid 20 and the resonator 10). A concave portion 21 formed by a surface of the bottom plate 22 and an inner surface of the side wall 23 is provided on a surface facing the resonator 10 of the lower lid 20. The concave portion 21 forms a part of the vibration space of the resonator 10. With the upper lid 30 and the lower lid 20, the vibration space is hermetically sealed, and is maintained in a vacuum state. In an exemplary aspect, the vibration space may be filled with gas such as inert gas, for example.

Resonator 10

Figure 3:
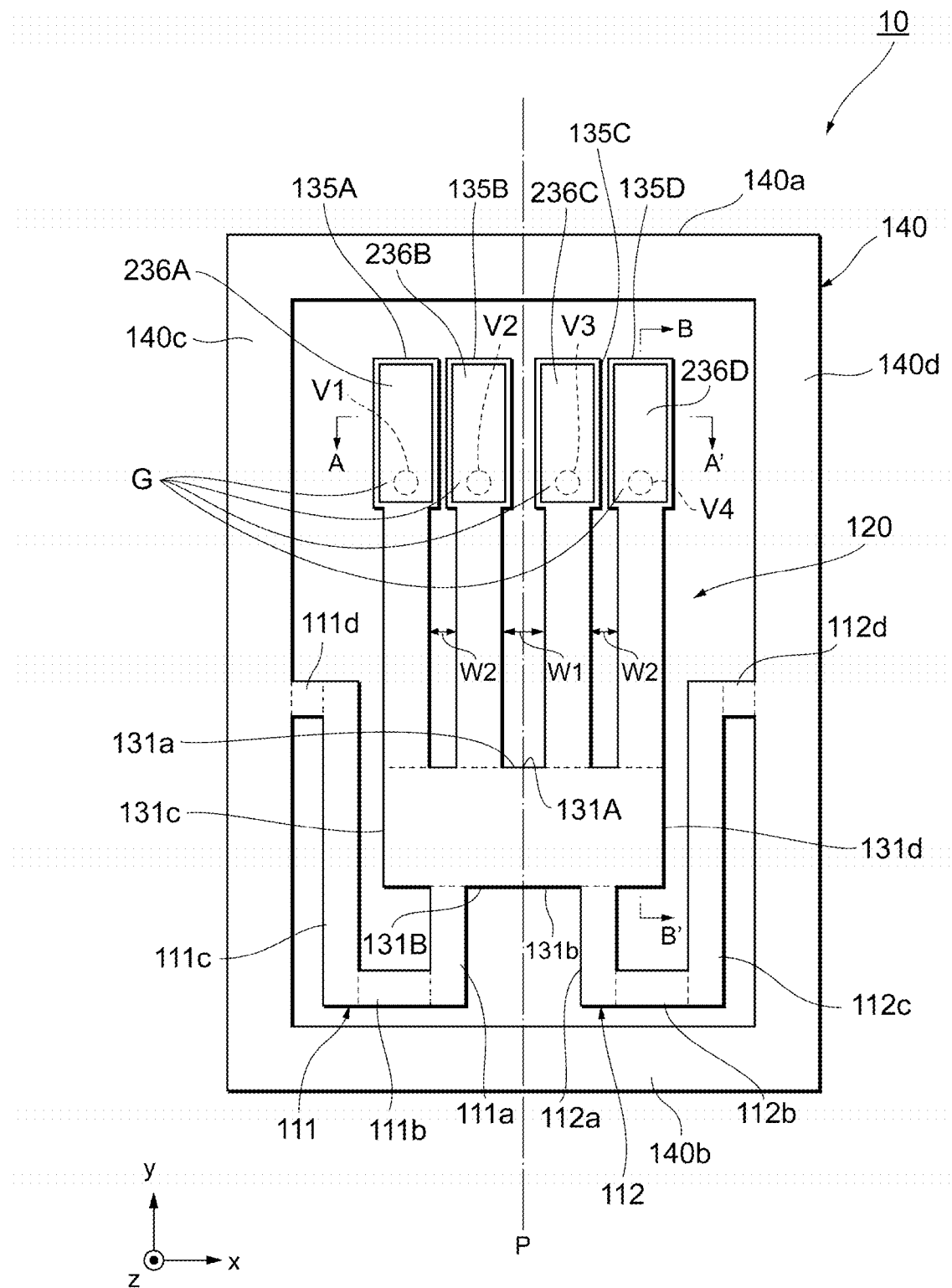
FIG. 3 is a plan view of a resonator according to the first exemplary embodiment of the present invention, in which an upper substrate is removed.

FIG. 3 is a plan view schematically showing a structure of the resonator 10 according to the present embodiment. Each component of the resonator 10 according to the present embodiment will be described with reference to FIG. 3. In general, the resonator 10 includes a vibration portion 120, a holding portion 140 (or frame), holding arms 111 and 112, and vias V1, V2, V3, and V4.

Vibration Portion 120

The vibration portion 120 has a rectangular contour extending along an XY plane in an orthogonal coordinate system shown in FIG. 3. The vibration portion 120 is provided inside the holding portion 140, and a space is formed between the vibration portion 120 and the holding portion 140 at a predetermined interval. In the example shown in FIG. 3, the vibration portion 120 includes a base portion 130 (also referred to simply as a base) and four vibration arms 135A to 135D (collectively referred to as "vibration arms 135"). It is noted that the number of the vibration arms is not limited to four, but may be set to any number of one or more (i.e., at least one or more vibration arms). In the present embodiment, the respective vibration arms 135 and the base portion 130 are formed integrally.

The base portion 130 has long sides 131a and 131b in an X-axis direction, and short sides 131c and 131d in a Y-axis direction in a plan view. The long side 131a is one side of a front end surface 131A (hereinafter also referred to as "front end 131A") of the base portion 130, and the long side 131b is one side of a rear end surface 131B (hereinafter also referred to as "rear end 131B") of the base portion 130. In the base portion 130, the front end 131A and the rear end 131B are provided so as to face each other.

The base portion 130 is connected to the vibration arms 135 which will be described later at the front end 131A, and is connected to the holding arms 111 and 112 which will be described later at the rear end 131B. It is noted that, in the example shown in FIG. 3, the base portion 130 has a substantially rectangular shape in a plan view, but is not limited thereto, and may be formed so as to be substantially symmetric with respect to a virtual plane P defined along a perpendicular bisector of the long side 131a. For example, the base portion 130 may have a trapezoidal shape in which the long side 131b is shorter than the long side 131a, or a semicircular shape in which the long side 131a is defined as a diameter. Further, the long sides 131a and 131b, the short sides 131c and 131d are not limited to straight lines, and may be curved lines.

In the base portion 130, a base portion length which is the maximum distance between the front end 131A and the rear end 131B in a direction from the front end 131A to the rear end 131B (a length of the short sides 131c and 131d in FIG. 3) is about 40 µm, for example. In addition, a base portion width which is the longest distance between the side ends of the base portion 130 in a width direction orthogonal to the base portion length direction (a length of the long sides 131a and 131b in FIG. 3) is about 285 µm, for example.

As shown, the vibration arms 135 extend in a Y-axis direction and have the same size in the exemplary aspect. Each of the vibration arms 135 is provided between the base portion 130 and the holding portion 140 in parallel to the Y-axis direction, and one end thereof is connected to the front end 131A of the base portion 130 to form a fixed end, and the other end thereof forms an open end. Further, the vibration arms 135 are provided in parallel with each other at a predetermined interval in the X-axis direction. The vibration arm 135 has a width in the X-axis direction of about 50 µm and a length in the Y-axis direction of about 420 µm, for example.

In an exemplary aspect, each of the vibration arms 135 has a weight portion G (i.e., a weight) at the open end thereof. As shown, the weight portion G is wider in the X-axis direction than the other portions of the vibration arm 135. The weight portion G has a width in the X-axis direction of about 70 µm, for example. The weight portion G is integrally formed by the same process as a formation process of the vibration arm 135. By forming the weight portion G, the weight per unit length of the vibration arm 135 is heavier at an open end side than at a fixed end side. Therefore, since each of the vibration arms 135 has the weight portion G at the open end side, an amplitude of vibration in a vertical direction in each of the vibration arms can be increased.

In the vibration portion 120 of the present embodiment, two vibration arms 135A and 135D are disposed at an outer side portion in the X-axis direction, and two vibration arms 135B and 135C are disposed at an inner side portion. As further shown an interval W1 between the vibration arms 135B and 135C in the X-axis direction is set to be larger than an interval W2 between the vibration arm 135A (135D) disposed at the outer side portion and the vibration arm 135B (135C) disposed at the inner side portion and being adjacent to the vibration arm 135A (135D) disposed at the outer side portion in the X-axis direction. The interval W1 is, for example, about 35 µm and the interval W2 is, for example, about 25 µm. By setting the interval W2 to be smaller than the interval W1, vibration characteristics are improved. Further, in order to miniaturize the resonance device 1, the interval W1 may be set to be smaller than the interval W2, or may be set to be equal to the interval W2.

As further shown, a protective film 235 is formed on a surface of the vibration portion 120 (i.e., a surface facing the upper lid 30) so as to cover the entire surface of the vibration portion 120. Further, frequency adjustment films 236A to 236D are formed on parts of a surface of the protective film 235 on the vibration arms 135A to 135D, respectively. It is noted that the frequency adjustment films 236A to 236D are an example of a conductive film and are also collectively referred to as frequency adjustment films 236 for purposes of this disclosure. A resonant frequency of the vibration portion 120 can be adjusted by the protective film 235 and the frequency adjustment films 236. It is noted that the protective film 235 does not necessarily cover the entire surface of the vibration portion 120, but it is preferable that the protective film 235 covers the entire surface of the vibration portion 120 in order to protect an underlying electrode film (for example, a metal layer E2 in FIG. 4) and a piezoelectric film (for example, a piezoelectric thin film F3 in FIG. 4) from damage in the frequency adjustment.

Moreover, the frequency adjustment film 236 is formed on the protective film 235 such that the surface thereof is exposed in at least a part of a region having a larger average displacement due to vibration than other regions in the vibration portion 120. Specifically, the frequency adjustment film 236 is formed at the distal end of the vibration arm 135, that is, in the weight portion G (one example of the second region). On the other hand, the surface of the protective film 235 is exposed in the other region (one example of the first region) of the vibration arm 135. In this embodiment, the frequency adjustment film 236 is formed to the distal end of the vibration arm 135, and the protective film 235 is not exposed at the distal end portion, but it is also possible to adopt a configuration in which the frequency adjustment film 236 is not formed at the distal end portion of the vibration arm 135 such that a part of the protective film 235 is exposed. It is also noted that a second frequency adjustment film may be formed on a base side (e.g., a side connected to the base portion 130) of the vibration arm 135. In this case, a change in temperature characteristics of the frequency due to the frequency adjustment can be suppressed.

Holding Portion 140

The holding portion 140 (also generally referred to as a frame) is formed in a rectangular frame shape along the XY plane. The holding portion 140 is provided so as to surround an outer side portion of the vibration portion 120 along the XY plane in a plan view. It is noted that the holding portion 140 may be provided in at least a part of a periphery of the vibration portion 120, and is not limited to the frame shape. For example, the holding portion 140 may be provided around the vibration portion 120 so as to be able to hold the vibration portion 120 and to be able to bond the upper lid 30 and the lower lid 20.

In this embodiment, the holding portion 140 is formed of frame bodies 140a to 140d each of which has a rectangular column shape and which are integrally formed. As shown in FIG. 3, the frame body 140a is provided so as to face open ends of the vibration arms 135, and a longitudinal direction thereof is parallel to the X-axis direction. The frame body 140b is provided so as to face the rear end 131B of the base portion 130, and the longitudinal direction thereof is parallel to the X-axis. The frame body 140c is provided so as to face a side end (i.e., the short side 131c) of the base portion 130 and the vibration arm 135A, the longitudinal direction thereof is parallel to the Y-axis, and respective ends thereof are individually connected to one end of the frame body 140a and one end of the frame body 140b. The frame body 140d is provided so as to face a side end (i.e., the short side 131d) of the base portion 130 and the vibration arm 135D, the longitudinal direction thereof is parallel to the Y-axis, and respective ends thereof are individually connected to the other end of the frame body 140a and the other end of the frame body 140b.

In the present embodiment, a case is described where the holding portion 140 is covered with the protective film 235, but the present invention is not limited thereto, and the protective film 235 may not be formed on the surface of the holding portion 140.

Holding Arms 111 and 112

The holding arm 111 and the holding arm 112 are provided in an inner side portion of the holding portion 140, and connect the rear end 131B of the base portion 130 to the frame bodies 140c and 140d. As shown in FIG. 3, the holding arm 111 and the holding arm 112 are formed substantially symmetrically with respect to a virtual plane P defined in parallel to the YZ plane along a center line in the X-axis direction of the base portion 130.

The holding arm 111 includes arms 111a, 111b, 111c, and 111d. Specifically, the holding arm 111 has one end connected to the rear end 131B of the base portion 130, and extends from the connected one end toward the frame body 140b. The holding arm 111 is bent in a direction toward the frame body 140c (that is, in the X-axis direction), is further bent in a direction toward the frame body 140a (that is, in the Y-axis direction), is bent in the direction toward the frame body 140c (that is, in the X-axis direction) again, and is connected to the frame body 140c at the other end thereof.

The arm 111a is provided between the base portion 130 and the frame body 140b so as to face the frame body 140c and to be parallel to the Y-axis in a longitudinal direction thereof. The arm 111a has one end connected to the base portion 130 at the rear end 131B, and extends from the connected one end substantially perpendicularly to the rear end 131B, that is, in the Y-axis direction. An axis passing through a center of the arm 111a in the X-axis direction is preferably provided in an inner side portion of a center line of the vibration arm 135A, and in the example shown in FIG. 3, the arm 111a is provided between the vibration arms 135A and 135B. Additionally, the other end of the arm 111a is connected to one end of the arm 111b on a side surface thereof. The arm 111a has a width defined in the X-axis direction of about 20 µm and a length defined in the Y-axis direction of 40 µm.

The arm 111b is provided between the base portion 130 and the frame body 140b so as to face the frame body 140b and to be parallel to the X-axis direction in a longitudinal direction thereof. In particular, the arm 111b has one end connected to the side surface of the arm 111a that is the other end of the arm 111a and that is at a side facing the frame body 140c, and extends from the connected one end substantially perpendicularly to the arm 111a, that is, in the X-axis direction. Further, the other end of the arm 111b is connected to a side surface of the arm 111c that is one end of the arm 111c and that is at a side facing the vibration portion 120. The arm 111b has a width defined in the Y-axis direction of about 20 µm, and a length defined in the X-axis direction of about 75 µm, for example.

The arm 111c is provided between the base portion 130 and the frame body 140c so as to face the frame body 140c, and to be parallel to the Y-axis direction in a longitudinal direction thereof. One end of the arm 111c is connected to the other end of the arm 111b on a side surface thereof, and the other end of the arm 111c is connected to a side surface that is one end of the arm 111d and that is at a side of the frame body 140c. The arm 111c has a width defined in the X-axis direction of about 20 µm and a length defined in the Y-axis direction of about 140 µm, for example.

The arm 111d is provided between the base portion 130 and the frame body 140c so as to face the frame body 140a and, to be parallel to the X-axis direction in a longitudinal direction thereof. One end of the arm 111d is connected to a side surface of the arm 111c that is the other end of the arm 111c and that is at a side facing the frame body 140c. Additionally, the arm 111d is connected to the frame body 140c at a position where the other end thereof faces a vicinity of a connection portion between the vibration arm 135A and the base portion 130, and extends from the position substantially perpendicular to the frame body 140c, that is, in the X-axis direction. The arm 111d has a width defined in the Y-axis direction of about 20 µm and a length defined in the X-axis direction of about 10 µm, for example.

In this manner, the holding arm 111 is connected to the base portion 130 at the arm 111a, is bent at a connection portion of the arm 111a and the arm 111b, a connection portion of the arm 111b and the arm 111c, and a connection portion of the arm 111c and the arm 111d, and thereafter, is connected to the holding portion 140.

The holding arm 112 has a similar configuration as holding arm 111. Specifically, the holding arm 112 includes arms 112a, 112b, 112c, and 112d. Moreover, the holding arm 112 has one end connected to the rear end 131B of the base portion 130, and extends from the connected one end toward the frame body 140b. The holding arm 112 is bent in a direction toward the frame body 140d (that is, in the X-axis direction), is further bent in a direction toward the frame body 140a (that is, in the Y-axis direction), is bent in a direction toward the frame body 140d (that is, in the X-axis direction) again, and is connected to the frame body 140d at the other end thereof.

It is otherwise noted that since configurations of the arms 112a, 112b, 112c and 112d are symmetrical with respect to those of the arms 111a, 111b, 111c and 111d, respectively, detailed description thereof will be omitted.

Vias V1, V2, V3, and V4

Figure 4:
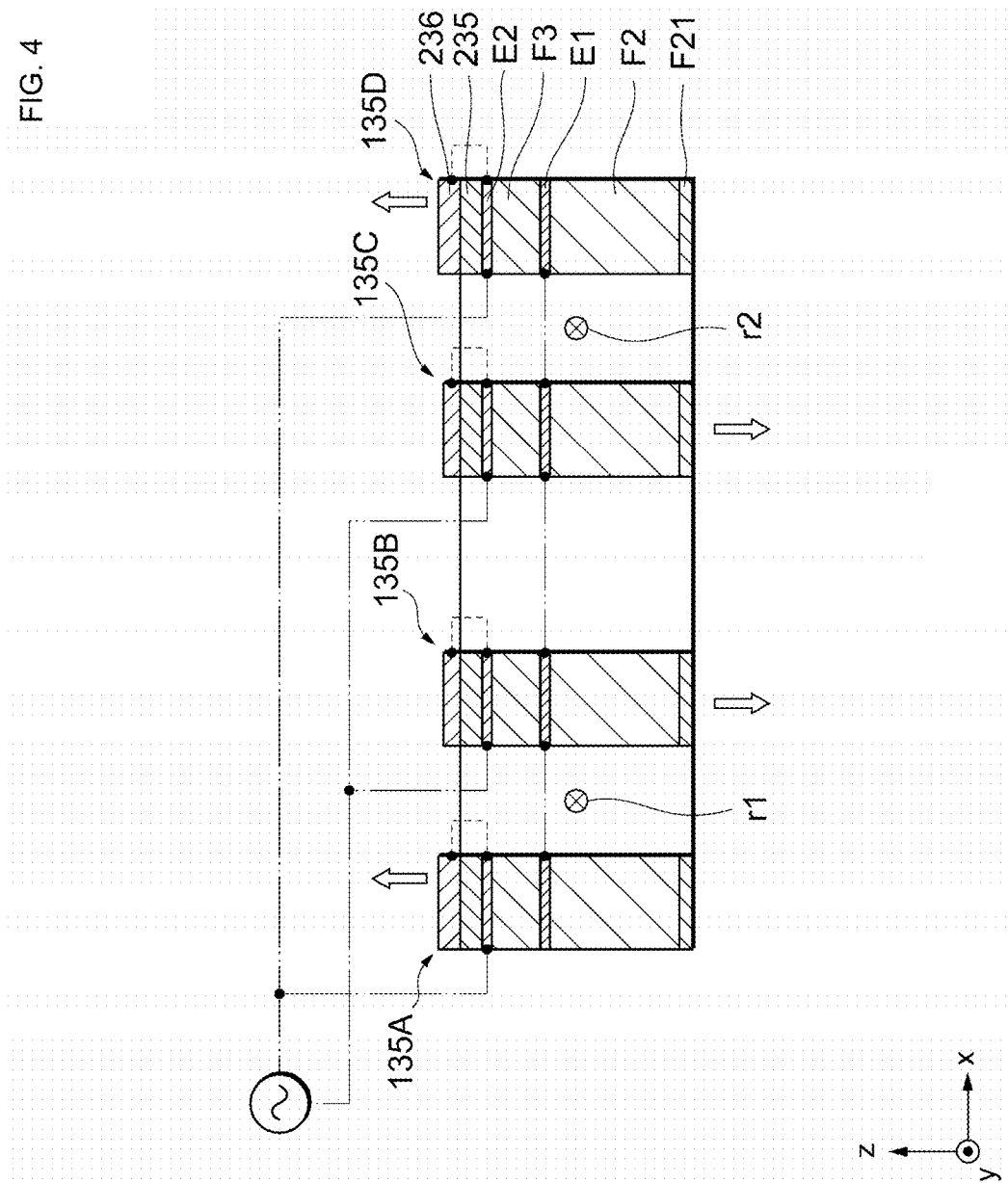
FIG. 4 is a cross-sectional view taken along a line AA' in FIG. 3.

The vias V1, V2, V3, and V4 are holes filled with metal and formed on vicinities of the distal end portions of the vibration arms 135, and electrically connect the frequency adjustment films 236A, 236B, 236C, and 236D and a metal layer E2 (see FIG. 4) described later. In FIG. 4, dashed lines indicate electrical connection, and in FIG. 3, dotted lines indicate electrical connection, particularly by vias V1, V2, V3, and V4.

As will be described in detail later, the vias V1, V2, V3, and V4 are formed in vicinities of boundaries between regions where the frequency adjustment films 236 are exposed and regions where the protective film 235 is exposed, at the distal end portions (i.e. distal ends) of the vibration arms 135A, 135B, 135C and 135D, respectively. In this embodiment, each of the vias V1, V2, V3, and V4 is formed at an end portion at a fixed end side of the weight portion G.

Laminated Structure

A laminated structure of the resonator 10 will be described with reference to FIG. 4. FIG. 4 is a schematic diagram schematically showing a cross section taken along the AA' line in FIG. 3 and an electrical connection mode of the resonator 10.

In the resonator 10, the holding portion 140, the base portion 130, the vibration arms 135, and the holding arms 111 and 112 are integrally formed by the same process. In the resonator 10, first, the metal layer E1 (one example of the lower electrode) is laminated on a Si (silicon) substrate F2, for example. Additionally, the piezoelectric thin film F3 (one example of the piezoelectric film) is formed on the metal layer E1 so as to cover the metal layer E1, and the metal layer E2 (one example of the upper electrode) is laminated on a surface (one example of the main surface) of the piezoelectric thin film F3. The protective film 235 is laminated on the metal layer E2 so as to cover the metal layer E2. On the vibration portion 120, the frequency adjustment film 236 is further laminated on the protective film 235. In this embodiment, the metal layer E2 does not extend to the distal end of the vibration arm. Thus, it is possible to suppress a change in characteristics due to short circuit between the metal layer E1 and the frequency adjustment film 236. Although it is desirable to perform patterning so as not to extend the metal layer E2 to the distal end of the vibration arm as described above, the metal layer E2 may be extended to the distal end of the vibration arm. In addition, it is also possible to omit the metal layer E1 by using a degenerate silicon substrate having low resistance, because the Si substrate F2 itself also serves as the metal layer E1.

According to an exemplary aspect, the Si substrate F2 is formed of a degenerate n-type Si semiconductor having a thickness of about 6 µm, for example, and may include P (phosphorus), As (arsenic), Sb (antimony), or the like as an n-type dopant. In particular, a rotation angle between the vibration arm 135 and a [100] crystal axis of the Si substrate F2 configured with an n-type Si semiconductor or its equivalent crystal axis is preferably larger than 0 degree and smaller than or equal to 15 degrees (or larger than or equal to 0 degree and smaller than or equal to 15 degrees), or larger than or equal to 75 degrees and smaller than or equal to 90 degrees. Here, the rotation angle is an angle in a direction in which the holding arm 110 extends with respect to a line segment along the [100] crystal axis of the Si substrate F2 or its equivalent crystal axis.

Further, a resistance value of the degenerate Si used for the Si substrate F2 is, for example, smaller than 1.6 mΩ·cm, and more preferably smaller than or equal to 1.2 mΩ·cm. Further, a silicon oxide (for example, $SiO_2$) layer (temperature characteristic correction layer) F21 is formed on a lower surface of the Si substrate F2. This configuration improves the temperature characteristics.

In the present embodiment, the silicon oxide layer (i.e., temperature characteristic correction layer) F21 is a layer having a function of reducing a temperature coefficient of frequency (that is, a change rate per temperature) at least around room temperature in the vibration portion when a temperature correction layer is formed on the Si substrate F2, in comparison with a case where the silicon oxide layer F21 is not formed on the Si substrate F2. Since the vibration portion 120 has the silicon oxide layer F21, it is possible to reduce a change in resonant frequency of the laminated structure formed of, for example, the Si substrate F2, the metal layers E1 and E2, the piezoelectric thin film F3, and the silicon oxide layer (temperature correction layer) F21, due to temperature.

In the resonator 10, the silicon oxide layer F21 is preferably formed to have a uniform thickness. For purposes of this disclosure it is noted that the uniform thickness means that variations in thickness of the silicon oxide layer F21 are within ±20% of an average value of the thicknesses.

Furthermore, the silicon oxide layer F21 may be formed on an upper surface of the Si substrate F2, or may be formed on both the upper surface and the lower surface of the Si substrate F2. In addition, in the holding portion 140, the silicon oxide layer F21 may not be formed on the lower surface of the Si substrate F2.

The metal layers E2 and E1 are formed using, for example, molybdenum (Mo), aluminum (Al) or the like having a thickness of about 0.1 to 0.2 Moreover, the metal layers E2 and E1 are formed to have a desired shape by etching or the like. The metal layer E1 is formed so as to function as a lower electrode, a float electrode, or a ground electrode, for example, on the vibration portion 120. In this embodiment, the metal layer E1 functions as the float electrode. Additionally, the metal layer E1 is formed on the holding arms 111 and 112 and the holding portion 140 so as to function as wiring for connecting the lower electrode or the ground electrode to an AC power supply provided outside the resonator 10.

On the other hand, the metal layer E2 is formed so as to function as an upper electrode on the vibration portion 120. Moreover, the metal layer E2 is formed on the holding arms 111 and 112 and the holding portion 140 so as to function as wiring for connecting the upper electrode to a circuit provided outside the resonator 10.

For connection from the AC power supply or ground to lower wiring or upper wiring, a configuration where an electrode (one example of an outer electrode) is formed on an outer surface of the upper lid 30 and the electrode connects a circuit and the lower wiring or the upper wiring, or a configuration where a via is formed in the upper lid 30, a conductive material is filled inside the via to provide wiring, and the wiring connects the AC power supply and the lower wiring or the upper wiring, may be used.

The piezoelectric thin film F3 is a thin film of a piezoelectric material that converts an applied voltage into vibration, and for example, a nitride such as AlN (aluminum nitride) or an oxide can be used as a main component. Specifically, the piezoelectric thin film F3 can be formed of ScAlN (scandium aluminum nitride), for example. ScAlN is a material in which a part of aluminum in aluminum nitride is replaced by scandium. The piezoelectric thin film F3 has a thickness of, for example, 1 but it is also possible to use a piezoelectric thin film having a thickness of about 0.2 μm to about 2 μm.

The piezoelectric thin film F3 expands and contracts in an in-plane direction of the XY plane, that is, in the Y-axis direction, according to an electric field applied to the piezoelectric thin film F3 by the metal layers E2 and E1. Due to the expansion and contraction of the piezoelectric thin film F3, the vibration arm 135 displaces its open end toward inner surfaces of the lower lid 20 and the upper lid 30, and vibrates in an out-of-plane bending vibration mode. It is noted that in the present embodiment, a configuration is used where, by dividing the upper electrode and connecting each divided upper electrode to the AC power supply in the out-of-plane bending vibration mode for four arms, two inner arms and two outer arms perform bending vibration in mutually opposite directions, but the present invention is not limited thereto. For example, a configuration where there is only one vibration arm, or a configuration where the vibration arm vibrates in an in-plane bending vibration mode, may be used.

Moreover, in the exemplary aspect, the protective film 235 is a layer of an insulator, and is formed of a material having a slower mass reduction rate by etching than that of the frequency adjustment film 236. For example, the protective film 235 is formed of a nitride film such as AlN or SiN, or an oxide film such as $Ta_2O_5$ (tantalum pentoxide), or $SiO_2$. It is also noted that the mass reduction rate is expressed by a product of an etching rate (i.e., a thickness removed per unit time) and a density. A thickness of the protective film 235 is equal to or less than half of a thickness (in a C-axis direction) of the piezoelectric thin film F3, and is, for example, about 0.2 μm in the present embodiment. Additionally, the more preferable thickness of the protective film 235 is about one fourth of the thickness of the piezoelectric thin film F3. In addition, when the protective film 235 is formed of a piezoelectric material such as AlN, it is preferable to use a piezoelectric material having the same orientation as that of the piezoelectric thin film F3.

The frequency adjustment film 236 is a conductive layer, and is formed of a material having a faster mass reduction rate by etching than that of the protective film 235. The frequency adjustment film 236 is made of, for example, a metal such as molybdenum (Mo), tungsten (W), gold (Au), platinum (Pt), nickel (Ni), aluminum (Al), or titanium (Ti).

When a relationship between the mass reduction rates of the protective film 235 and the frequency adjustment film 236 is the same as that described above, a magnitude relationship between the etching rates is arbitrary.

The frequency adjustment film 236 is formed substantially over the entire surface of the vibration portion 120, and then is formed only in a predetermined region by etching or the like.

The protective film 235 and the frequency adjustment film 236 are etched by, for example, simultaneously irradiating the protective film 235 and the frequency adjustment film 236 with an ion beam (for example, an argon (Ar) ion beam). The ion beam can be irradiated over a wider area than the resonator 10. Moreover, although an example in which etching is performed by an ion beam is described in the present embodiment, the etching method is not limited to that using an ion beam.

Function of Resonator

A function of the resonator 10 will be described with reference to FIG. 4. In this embodiment, a phase of an electric field applied to the vibration arms 135A and 135D disposed at the outer side portion and a phase of an electric field applied to the vibration arms 135B and 135C disposed at the inner side portion are set to be opposite to each other. Thus, the vibration arms 135A and 135D disposed at the outer side portion and the vibration arms 135B and 135C disposed at the inner side portion are displaced in the opposite directions to each other. For example, when the open ends of the vibration arms 135A and 135D disposed at the outer side portion are displaced toward the inner surface of the upper lid 30, the open ends of the vibration arms 135B and 135C disposed at the inner side portion are displaced toward the inner surface of the lower lid 20.

Accordingly, in the exemplary resonator 10, the vibration arm 135A and the vibration arm 135B vibrate in the reverse phases, that is, in vertically reverse directions around a central axis r1 that extends in parallel to the Y-axis between the vibration arm 135A and the vibration arm 135B shown in FIG. 4. Further, the vibration arm 135C and the vibration arm 135D vibrate in vertically reverse directions around a central axis r2 that extends in parallel to the Y-axis between the vibration arm 135C and the vibration arm 135D. As a result, torsional moments in reverse directions are generated at the central axes r1 and r2, and bending vibration is generated in the base portion 130.

Function of Frequency Adjustment Film

Next, a function of the frequency adjustment film 236 will be described. In the resonance device 1 according to the present embodiment, after the resonator 10 is formed as described above, a trimming process for adjusting the film thickness of the frequency adjustment film 236 is performed.

In the trimming process, the resonant frequency of the resonator 10 is first measured, and a deviation with respect to a target frequency is calculated. Next, the film thickness of the frequency adjustment film 236 is adjusted based on the calculated frequency deviation. The adjustment of the film thickness of the frequency adjustment film 236 can be performed by, for example, irradiating an argon (Ar) ion beam over the entire surface of the resonance device 1 to etch the frequency adjustment film 236. Further, when the film thickness of the frequency adjustment film 236 is adjusted, it is preferable to clean the resonator 10 and remove the scattered film.

By adjusting the film thickness of the frequency adjustment film 236 by the trimming process as described above, variations in frequency can be suppressed among a plurality of resonance devices 1 that are manufactured on the same wafer.

Connection Mode

Figure 5:
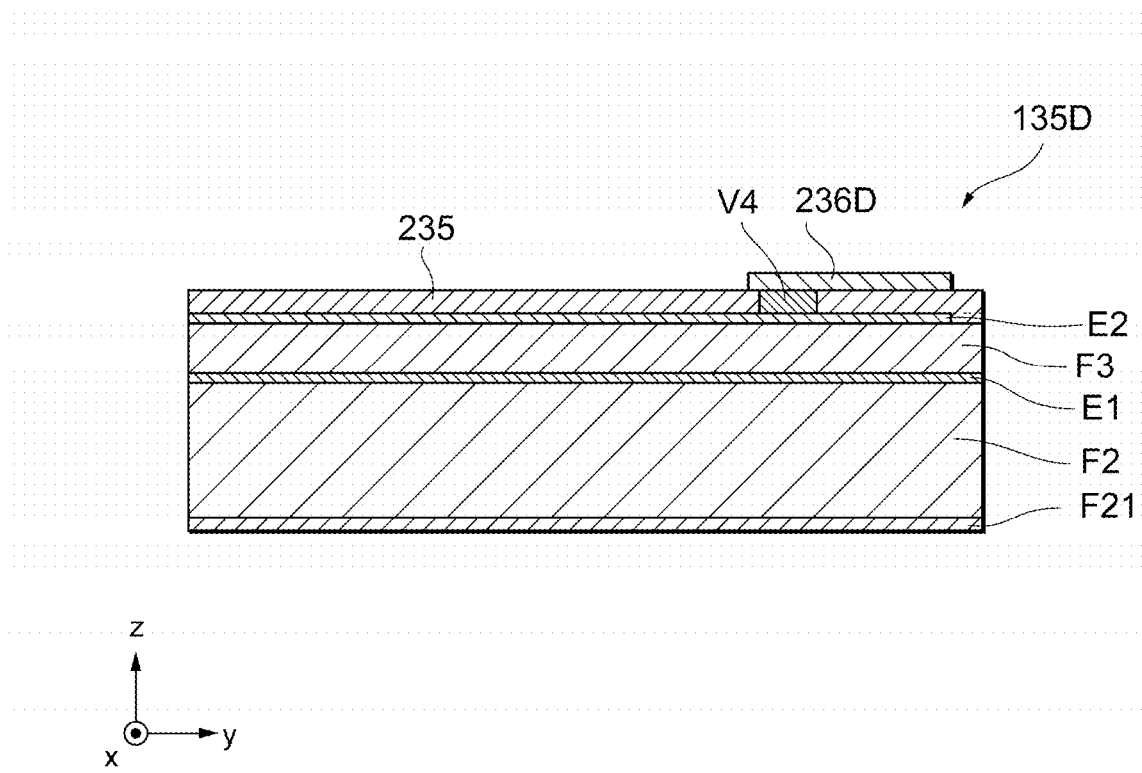
FIG. 5 is a cross-sectional view taken along a line BB' in FIG. 3.

A connection mode between the frequency adjustment film 236 and the metal layer E2 in the resonator 10 according to the present embodiment will be described with reference to FIG. 5. FIG. 5 is a schematic diagram schematically showing a cross section taken along the line BB' in FIG. 3, and shows a case where the frequency adjustment film 236D is connected to the metal layer E2.

As shown in FIG. 5, the via V4 is formed by filling a conductive material a hole in which a part of the protective film 235 is removed such that a surface of the metal layer E2 is exposed with a conductive material. The conductive material to be filled in the via V4 is, for example, Mo (molybdenum), aluminum (Al), or the like.

An effect of the frequency adjustment film 236 being electrically connected to the metal layer E2 will be described. In the above-described trimming process, when the ion beam is irradiated to the resonator 10, the protective film 235 is also irradiated with the ion beam, so that the protective film 235 is charged by electric charges included in the ion beam. In addition, when a pyroelectric material is used for the protective film 235, a pyroelectric effect is generated due to temperature rise and fall, so that the electric charges are deposited on an interface of the protective film 235.

In the exemplary resonator 10, the frequency adjustment film 236D that is made of a conductive material that is formed on a part of the protective film 235 is connected to the metal layer E2 with the via V4 interposed therebetween. Thereby, the electric charges charged in the protective film 235 can be transferred to the metal layer E2. As such, the electric charges transferred to the metal layer E2 can be released to an outside of the resonance device 1 via a connection terminal connected to the outside and connected to the metal layer E2. As described above, in the resonator 10 according to the present embodiment, the electric charges are prevented from being charged in the protective film 235 formed on the vibration portion 120, so variations in resonant frequency due to the electric charges charged in the vibration portion 120 can be prevented.

Further, by connecting the frequency adjustment film 236D to the metal layer E2, a conductive layer (i.e., frequency adjustment film 236) formed on the protective film 235 can be connected to a layer close to the protective film 235. Thereby, influence of the electric charges charged in the protective film 235 on the resonant frequency can be further reduced. When the frequency adjustment film 236D is connected to the metal layer E2, when a piezoelectric material such as AlN is used for the protective film 235, the piezoelectric material is preferably used having the same orientation as that of the piezoelectric thin film F3. Thus, the frequency adjustment film 236D can be connected to the metal layer E2 without inhibiting the vibration of the vibration arm 135.

Further, since the via V4 is formed in a vicinity of a boundary between a region where the frequency adjustment film 236D is exposed and a region where the protective film 235 is exposed, not in a vicinity of the open end of the vibration arm 135D, deterioration in strength of the distal end portion of the vibration arm 135D can be reduced. For example, when the resonance device 1 is dropped, the distal end (open end) of the vibration arm 135D may hit the upper lid 30. At this time, when a via is formed at the distal end portion of the vibration arm 135D, impact is concentrated on the via V4, so that the via V4 is damaged. According to the resonator 10 of the present embodiment, the via V4 is formed in the vicinity of the boundary between the region where the frequency adjustment film 236D is exposed and the region where the protective film 235 is exposed, not in the vicinity of the open end of the vibration arm 135D. As a result, even when the vibration arm 135D hits the upper lid 30, the concentration of the impact on the via V4 is reduced, so that the via V4 can be prevented from being damaged.

It is noted that connection modes, materials, effects, and the like of the vias V1, V2, and V3 are similar to those of the via V4, so that description thereof will be omitted.

Second Exemplary Embodiment

In the second and subsequent embodiments, description of the same components and functionality as those in the first embodiment will be omitted, and only different points will be described. In particular, similar effects with the similar configuration will not be fully described for each embodiment.

Figure 6:
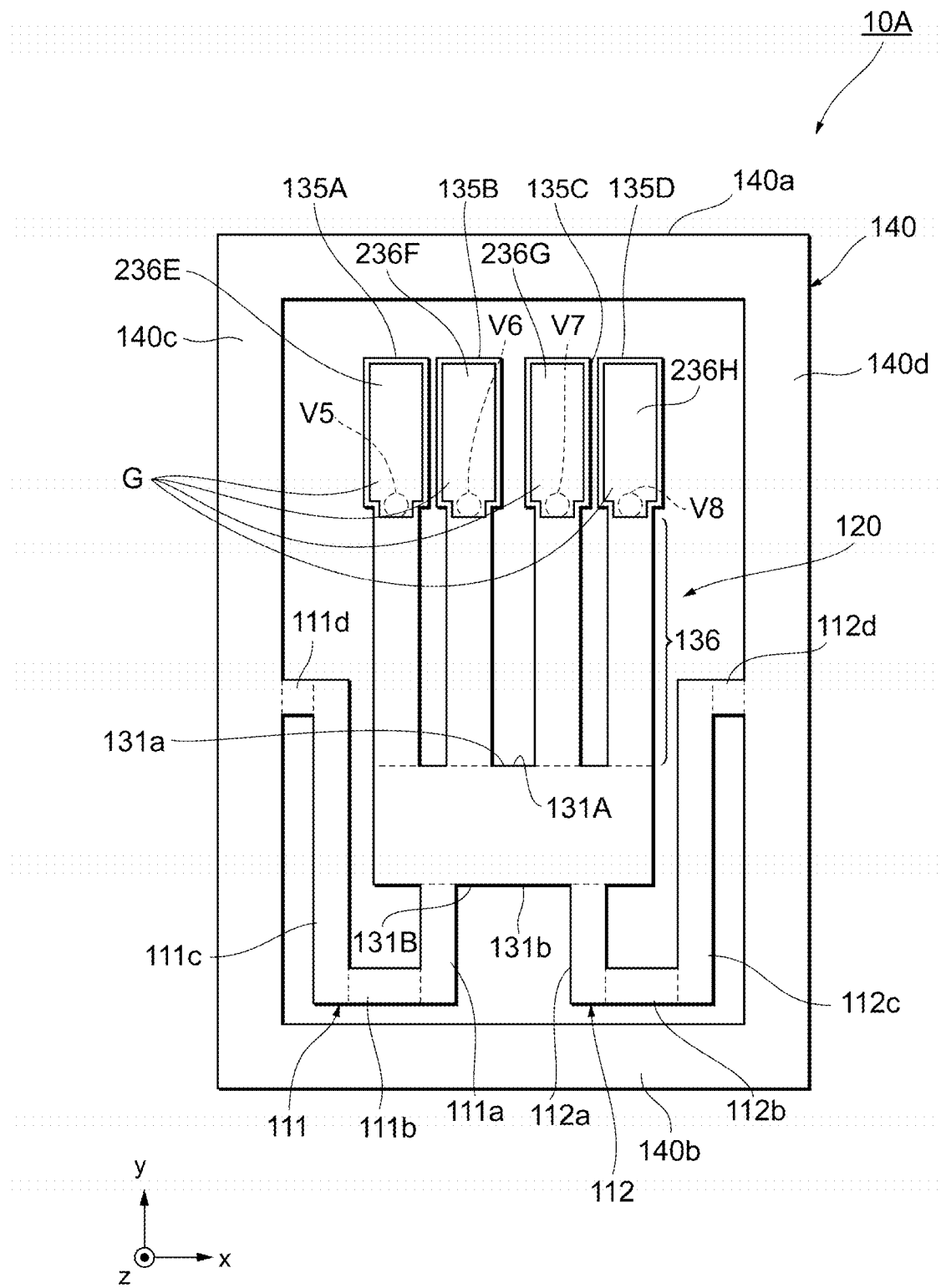
FIG. 6 is a plan view of a resonator according to a second exemplary embodiment of the present invention.

FIG. 6 is a plan view schematically showing an example of a structure of a resonator 10A according to the present embodiment. Hereinafter, description of a difference between the detailed configurations of the resonator 10A according to the present embodiment and the resonator 10 according to the first embodiment will be mainly given. The resonator 10A according to the present embodiment includes frequency adjustment films 236E to 236H and vias V5 to V8 instead of the frequency adjustment films 236A to 236D, and the vias V1, V2, V3, and V 4 described above in the first embodiment. In the present embodiment, for ease of explanation, a region in which the weight portion G in the vibration arm 135 is not formed is referred to as an arm 136.

Frequency Adjustment Films 236E to 236H

In the present embodiment, each of the frequency adjustment films 236E to 236H is exposed from the region where the weight portion G is formed to a region of the arm 136. That is, each of the frequency adjustment films 236E to 236H is exposed in a vicinity of a connection portion with the weight portion G in the arm 136 of the vibration arm 135 and in the weight portion G.

It is noted that the other configurations of the frequency adjustment films 236E to 236H are similar to those of the frequency adjustment films 236A to 236D in the first embodiment.

Vias V5 to V8

In the present embodiment, each of the vias V5 to V8 is formed on the frequency adjustment films 236E to 236H in the vibration arms 135A to 135D, respectively. Specifically, each of the vias V5 to V8 is formed in the vicinity of the connection portion with the weight portion G in the arm 136 of the vibration arm 135.

Other configurations of the vias V5 to V8 are similar to those of the vias V1 to V4 in the first embodiment.

Moreover, other configurations and functions of the resonance device 1 are similar to those of the first embodiment and will not be repeated herein.

Third Exemplary Embodiment

Figure 7:
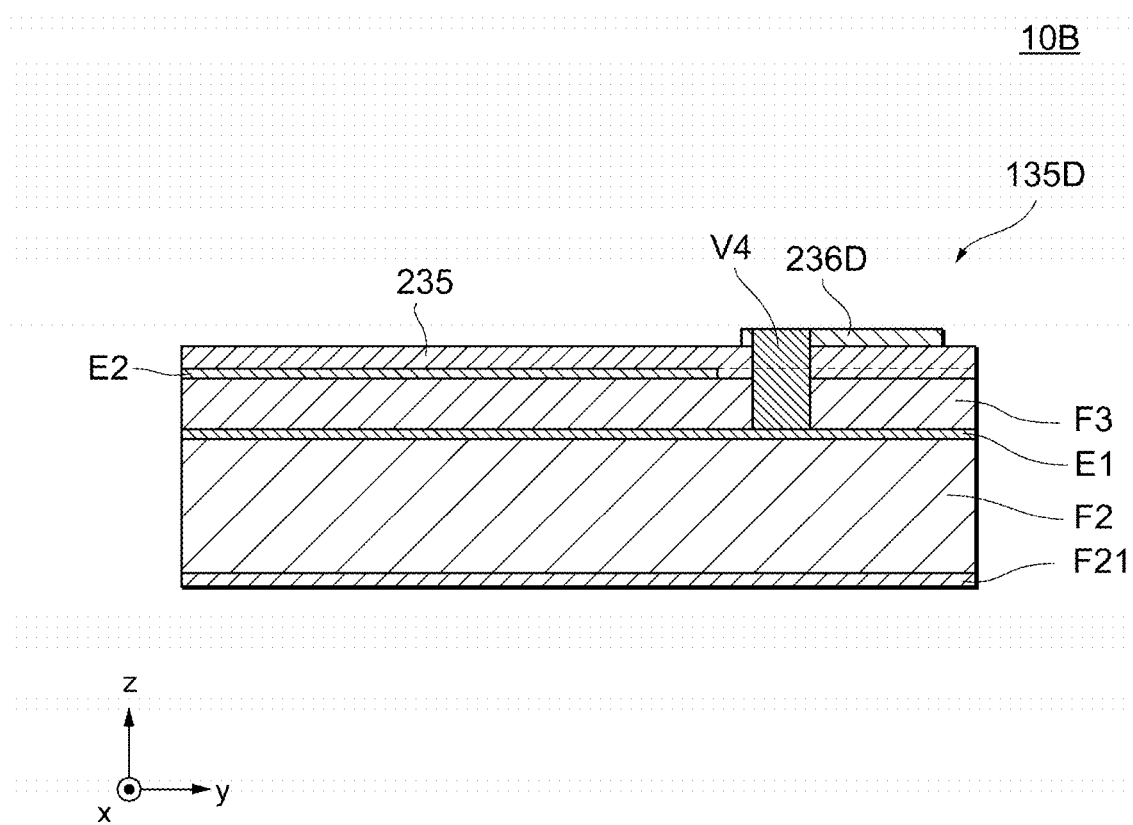
FIG. 7 is a cross-sectional view of a resonator according to a third embodiment of the present invention.

A configuration and a function of a resonator 10B according to the third exemplary embodiment will be described with reference to FIG. 7. FIG. 7 corresponds to FIG. 5, and is a cross-sectional view of the resonator 10B according to the present embodiment. As shown in FIG. 7, in the resonator 10B, the frequency adjustment film 236D is connected to the metal layer E1. In this case, the via V4 is formed by filling, with a conductive material, a hole in which parts of the protective film 235, the metal layer E2, and the piezoelectric thin film F3 are removed such that the surface of the metal layer E1 is exposed. The frequency adjustment film 236D is connected to the metal layer E1 with the via V4 interposed therebetween.

Further, the metal layer E2 is formed by adjusting an area of a region of the metal layer E2 that overlaps the frequency adjustment film 236 as small as possible. For example, the metal layer E2 is preferably formed such that the region overlapping the frequency adjustment film 236 is smaller than or equal to half of an area of the frequency adjustment film 236. For example, in a direction in which the vibration arm 135A extends, a length of the overlapping region between the metal layer E2 and the frequency adjustment film 236 may be shorter than or equal to half of a length of the metal layer E2. It is noted that, in this exemplary embodiment, the frequency adjustment film 236 is formed in the weight portion G, and the metal layer E2 is formed in a region other than the weight portion G in the vibration arm 135.

When the metal layer E1 and the frequency adjustment film 236D are connected to each other, electric fields in reverse directions are applied to the protective film 235 and the piezoelectric thin film F3. Therefore, when the overlapping region between the metal layer E2 and the frequency adjustment film 236 is large, the vibration of the resonator 10 is inhibited. According to the resonator 10B according to the present embodiment, the overlapping region between the metal layer E2 and the frequency adjustment film 236 is set to be as small as possible. Thus, vibration of the piezoelectric thin film F3 is not inhibited by the electric field applied to the protective film 235. Connection modes, materials, effects, and the like of the vias V1, V2, and V3 are similar to those of the via V4, so that description thereof will be omitted.

The other configurations of the resonator 10B are similar to those of the resonator 10 in the first embodiment and will not be repeated herein.

It is noted that the exemplary embodiments of the present invention have been described above. Accordingly, resonator 10 according to an exemplary embodiment of the present invention includes the vibration portion 120 including the vibration arm 135 that has the fixed end and the open end and that performs bending vibration, and the base 130 including a front end connected to the fixed end of the vibration arm 135, and a rear end facing the front end. Moreover, resonator 10 includes the holding portion 140 provided so as to surround at least a part of the vibration portion 120, and the holding arms 111 and 112 connecting the vibration portion 120 and the holding portion 140. The vibration portion 120 includes the upper electrode E2 and the lower electrode E1, with the piezoelectric film F3 provided between the upper electrode E2 and the lower electrode E1, having the main surface facing the upper electrode E2, and causing bending vibration of the vibration arm 135 when a voltage is applied between the upper electrode E2 and the lower electrode E1. The protective film 235 is provided so as to face the main surface of the piezoelectric film F3 with the upper electrode E2 interposed between the protective film 235 and the main surface of the piezoelectric film F3, exposed in a first region in the vibration arm 135, and made of an insulator, the conductive film 236 is provided so as to face the main surface of the piezoelectric film F3 with the protective film 235 interposed between the conductive film 236 and the main surface of the piezoelectric film F3, and exposed in a second region that is a region being in a vicinity of the open end and being adjacent to the first region in the vibration arm 135. In addition, the via electrodes V1 to V4 are formed in the protective film 235 to electrically connect the conductive film 236 to any one of the upper electrode E2 and the lower electrode E1, and each of the via electrodes V1 to V4 is positioned in a portion that is closer to the first region than the open end in the second region of the vibration arm 135 and when the main surface of the piezoelectric film F3 is viewed in a plan view.

In the resonator 10 according to an exemplary embodiment of the present invention, the frequency adjustment film 236 made of a conductive material is connected to the upper electrode E2 or the lower electrode E1 with the vias V1 to V4 interposed therebetween. As a result, the electric charges charged in the protective film 235 can be transferred to the upper electrode E2 or the lower electrode E1. The electric charges transferred to the upper electrode E2 or the lower electrode E1 can be released to an outside of the resonance device 1 via a connection terminal connected to the outside and connected to the upper electrode E2 or the lower electrode E1.

As described above, in the resonator 10 according to the exemplary embodiment, the electric charges are prevented from being charged in the protective film 235 formed on the vibration portion 120, so that it is possible to prevent variations in resonant frequency due to the electric charges charged in the vibration portion 120. Further, since each of the vias V1 to V4 is formed in a vicinity of a boundary between a region where the frequency adjustment film 236 is exposed and a region where the protective film 235 is exposed, not in a vicinity of the open end of the vibration arm 135, the deterioration in strength of the distal end portion of the vibration arm 135 can be reduced.

Further, it is preferable that the vibration arm 135 includes the weight portion G formed in the vicinity of the open end and having a width larger than that of the other region, and the arm portion 136 connected to the weight portion G. In this case, the second region may include a region of at least a part of the weight portion G. Further, the second region may further include a region in a vicinity of a connection portion with the weight portion G in the arm portion 136.

In addition, it is preferable that each of the via electrodes V1 to V4 is positioned within a region of the weight portion G of the second region when the main surface of the piezoelectric film F3 is viewed in a plan view. Further, each of the via electrodes V5 to V8 may be positioned within a region of the arm portion 136 of the second region when the main surface of the piezoelectric film F3 is viewed in a plan view.

In addition, it is preferable that the upper electrode E2 extends from the first region to the second region of the vibration arm 135 when the main surface of the piezoelectric film F3 is viewed in a plan view, and each of the via electrodes V1 to V4 electrically connects the piezoelectric film F3 to the upper electrode E2. According to this preferred embodiment, a conductive layer (i.e., frequency adjustment film 236) formed on the protective film 235 can be connected to a layer close to the protective film 235. Thereby, the influence of the electric charges charged in the protective film 235 on the resonant frequency can be further reduced.

Further, the upper electrode E2 may extend in the first region of the vibration arm 135 so as not to substantially overlap the second region when the main surface of the piezoelectric film F3 is viewed in a plan view, and the via electrodes V1 to V4 may electrically connect the piezoelectric film F3 to the lower electrode E1. According to this preferred embodiment, it is possible to suppress the vibration of the piezoelectric thin film F3 from being inhibited due to the electric field generated in the protective film 235.

Additionally, the resonance device 1 according to the present embodiment includes the resonator 10 described above, the upper lid 30 and the lower lid 20 provided to face each other with the resonator 10 interposed therebetween, and an outer electrode. Since the resonance device 1 according to the present embodiment can suppress electric charges from being charged in the protective film 235 formed on the vibration portion 120, variations in resonant frequency due to electric charges charged in the vibration portion 120 can be prevented.

It should be appreciated that the embodiments described above are intended to facilitate understanding of the present invention, and are not intended to limit the present invention. The present invention may be modified or improved without departing from the spirit and scope of the present invention. That is, various design modifications of each embodiment to be made by those skilled in the art as appropriate are included within the scope of the present invention as long as the features of the present invention are included. For example, the respective elements, the arrangement thereof, the materials, the conditions, the shapes, the sizes and the like included in each embodiment are not limited to those exemplified, and can be modified as appropriate.

For example, in the embodiments described above, the laminated body configured with the metal layer E2 and the piezoelectric thin film F3 has been described as a configuration having a single layer, but the present invention is not limited thereto. The resonator 10 may have a configuration in which the laminated body configured with the metal layer E2 and the piezoelectric thin film F3 is of multilayer, and the protective film 235 is formed on a surface of the uppermost layer (e.g., at an upper lid 30 side). Moreover, it goes without saying that the embodiments are merely examples, and partial substitutions or combinations of the configurations shown in different embodiments are possible, and these are also included within the scope of the present invention as long as they include the features of the present invention.

REFERENCE SIGNS LIST

1 RESONANCE DEVICE
10 RESONATOR
30 UPPER LID
20 LOWER LID
140 HOLDING PORTION
140a TO 140d FRAME BODY
111, 112 HOLDING ARM
120 VIBRATION PORTION
130 BASE PORTION
135A TO 135D VIBRATION ARM
F2 Si SUBSTRATE
F21 SILICON OXIDE LAYER (TEMPERATURE CHARACTERISTIC CORRECTION LAYER)
V1 TO V8 VIA
235 PROTECTIVE FILM
236 FREQUENCY ADJUSTMENT FILM

The invention claimed is:

1. A resonator comprising:
a vibration portion including:
at least one vibration arm configured to perform bending vibration and having a fixed end and an open end, and
a base including a front end connected to the fixed end of the at least one vibration arm and a rear end opposite the front end;
a frame that at least partly surrounds the vibration portion; and
a holding arm that connects the vibration portion to the frame,
wherein the vibration portion includes:
an upper electrode and a lower electrode,
a piezoelectric film disposed between the upper and lower electrodes and with a main surface that faces the upper electrode, the piezoelectric film being configured to cause bending vibration of the at least one vibration arm when a voltage is applied between the upper and lower electrodes,
a protective film that is an insulator and that faces the main surface of the piezoelectric film with the upper electrode interposed therebetween, with the protective film being exposed in a first region of the at least one vibration arm,
a conductive film that faces the main surface of the piezoelectric film with the protective film interposed therebetween, with the conductive film being exposed in a second region at the open end and adjacent to the first region in the at least one vibration arm, and
a via electrode extending in the protective film to electrically connect the conductive film to one of the upper and lower electrodes, with the via electrode positioned in the second region and closer to the first region than the open end of the vibration arm in a plan view of the main surface.

2. The resonator according to claim 1, wherein the at least one vibration arm includes a weight disposed at the open end and being wider than remaining regions of the at least one vibration arm, and an arm that connects the weight to the base.

3. The resonator according to claim 2, wherein the weight is at least partially disposed in the second region.

4. The resonator according to claim 3, wherein the second region further includes a region in a connection portion with the weight in the arm of the at least one vibration arm.

5. The resonator according to claim 3, wherein the via electrode is positioned within a region of the weight of the second region in the plan view of the main surface of the piezoelectric film.

6. The resonator according to claim 4, wherein the via electrode is positioned within a region of the arm of the second region in the plan view of the main surface of the piezoelectric film.

7. The resonator according to claim 1, wherein the upper electrode extends from the first region to the second region of the at least one vibration arm in the plan view of the main surface of the piezoelectric film.

8. The resonator according to claim 7, wherein the via electrode electrically connects the conductive film to the upper electrode.

9. The resonator according to claim 8, wherein the upper electrode extends to the open end of the vibration arm in the plan view of the main surface of the piezoelectric film.

10. The resonator according to claim 1, wherein the upper electrode extends in the first region of the at least one vibration arm so as not to overlap the conductive film in the second region in the plan view of the main surface of the piezoelectric film.

11. The resonator according to claim 10, wherein the via electrode electrically connects the conductive film to the lower electrode.

12. A resonator comprising:
a base;
at least one vibration arm configured to perform bending vibration and having an open end and a fixed end coupled to the base, the at least one vibration arm including:
an upper electrode and a lower electrode,
a piezoelectric film disposed between the upper and lower electrodes,
a protective film that is an insulator and that is disposed above the piezoelectric film with the upper electrode interposed therebetween, such that the protective film is disposed in a first region of the at least one vibration arm,
a conductive film disposed above the piezoelectric film with the protective film interposed therebetween, such that the conductive film is disposed in a second region of the at least one vibration arm that is adjacent to the first region and that is closer to the open end than the fixed end of the at least one vibration arm, and
a via electrode that extends through the protective film to electrically connect the conductive film to one of the upper and lower electrodes,
wherein the via electrode is positioned in the second region and closer to the fixed end than the open end of the vibration arm in a plan view of the piezoelectric film.

13. The resonator according to claim 12, wherein the piezoelectric film is configured to cause bending vibration of the at least one vibration arm when a voltage is applied between the upper and lower electrodes.

14. The resonator according to claim 12, wherein the at least one vibration arm includes a weight disposed at the open end and is at least partially disposed in the second region of the at least one vibration arm.

15. The resonator according to claim 14, wherein the via electrode is positioned within a region of the weight of the second region in the plan view of the main surface of the piezoelectric film.

16. The resonator according to claim 12, wherein the upper electrode extends from the first region to the second region of the at least one vibration arm in the plan view of the main surface of the piezoelectric film.

17. The resonator according to claim 16, wherein the via electrode electrically connects the conductive film to the upper electrode.

18. The resonator according to claim 17, wherein the upper electrode extends to the open end of the vibration arm in the plan view of the main surface of the piezoelectric film.

19. The resonator according to claim 12,
wherein the upper electrode extends in the first region of the at least one vibration arm so as not to overlap the conductive film in the second region in the plan view of the main surface of the piezoelectric film, and
wherein the via electrode electrically connects the conductive film to the lower electrode.

20. A resonance device comprising:
a resonator comprising:
a vibration portion including
at least one vibration arm configured to perform bending vibration and having a fixed end and an open end, and
a base including a front end connected to the fixed end of the at least one vibration arm and a rear end opposite the front end;
a frame that at least partly surrounds the vibration portion; and
a holding arm that connects the vibration portion to the frame,
wherein the vibration portion includes:
an upper electrode and a lower electrode,
a piezoelectric film disposed between the upper and lower electrodes and with a main surface that faces the upper electrode, the piezoelectric film being configured to cause bending vibration of the vibration arm when a voltage is applied between the upper and lower electrodes,
a protective film that is an insulator and that faces the main surface of the piezoelectric film with the upper electrode interposed therebetween, with the protective film being exposed in a first region of the at least one vibration arm,
a conductive film that faces the main surface of the piezoelectric film with the protective film interposed therebetween, with the conductive film being exposed in a second region at the open end and adjacent to the first region of the at least one vibration arm, and
a via electrode extending in the protective film to electrically connect the conductive film to one of the upper and lower electrodes, with the via electrode positioned in the second region and closer to the first region than the open end of the vibration arm in a plan view of the main surface;

an upper lid and a lower lid that face each other with the resonator interposed therebetween; and an outer electrode to one of the upper and lower electrodes.

* * * * *